United States Patent

Chou et al.

[11] Patent Number: 5,962,900
[45] Date of Patent: Oct. 5, 1999

[54] HIGH-DENSITY DIODE-BASED READ-ONLY MEMORY DEVICE

[75] Inventors: Jih-Wen Chou; Jemmy Wen, both of Hsinchu, Taiwan

[73] Assignee: United Microelectronics Corporation, Taiwan

[21] Appl. No.: 08/909,726

[22] Filed: Aug. 12, 1997

[30] Foreign Application Priority Data

Jun. 7, 1997 [TW] Taiwan .................................. 86107868

[51] Int. Cl.$^6$ ............................. H01L 29/40; H01L 29/41
[52] U.S. Cl. ......................... 257/368; 257/372; 257/390; 257/394; 257/926; 365/104; 365/105; 365/175; 365/177
[58] Field of Search .................................. 257/390, 368, 257/372, 394, 926; 365/104, 105, 103, 175, 177

[56] References Cited

U.S. PATENT DOCUMENTS

| | | | |
|---|---|---|---|
| 4,384,345 | 5/1983 | Mikome | 365/104 |
| 4,390,971 | 6/1983 | Kuo | 365/104 |
| 5,600,171 | 2/1997 | Mikahara et al. | 257/390 |

FOREIGN PATENT DOCUMENTS

| | | | |
|---|---|---|---|
| 60-176266 | 9/1985 | Japan | 257/390 |
| 4115565 | 4/1992 | Japan | 257/390 |

*Primary Examiner*—William Mintel
*Attorney, Agent, or Firm*—Rabin & Champagne, P.C.

[57] ABSTRACT

A read-only memory (ROM) device of the type including an array of diode-based memory cells for permanent storage of binary-coded data. The ROM device is partitioned into a memory division and an output division. The memory cells are formed over an insulating layer in the memory division. The insulating layer separates the memory cells from the underlying substrate such that the leakage current that can otherwise occur therebetween can be prevented. Moreover, the coding process is performing by forming contact windows at selected locations rather than by performing ion-implantation as in conventional methods. The fabrication process is thus easy to perform. Since the memory cells are diode-based rather than MOSFET-based, the punch-through effect that usually occurs in MOSFET-based memory cells can be prevented. The diode-based structure also allows the packing density of the memory cells on the ROM device to be dependent on the line width of the polysilicon layers in the ROM device. The feature size of the ROM device is thus dependent on the capability of the photolithographic process. The integration of the ROM device is thus high. The output division includes a plurality of MOSFETs whose gates are coupled to the memory cells in such a manner that the binary data can be read out by detecting the currents in the source/drain regions of these MOSFETs.

10 Claims, 6 Drawing Sheets

HIGH-DENSITY DIODE-BASED READ-ONLY MEMORY DEVICE

BACKGROUND OF THE INVENTION

1. Field of the Invention

This invention relates to semiconductor memory devices, and more particularly, to a semiconductor read-only memory (ROM) device of the type including an array of diode-based memory cells for permanent storage of binary-coded data. Moreover, the invention relates to a method of fabricating such a ROM device.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the data to be permanently stored in ROMs is usually first defined by the customer and then furnished to the factory to be programmed into the ROMs.

Most ROMs are identical in semiconductor structure except for the different data stored therein. Therefore, the ROM devices can be fabricated up to the stage ready for the programming and then the semi-finished products are stocked in inventories waiting for customer orders. The customer then furnishes the data to the factory where the data are stored into the semi-finished ROMs by using the so-called mask programming process. This procedure is now a standard method in the semiconductor industry for fabricating ROMs.

In most conventional ROMs, metal-oxide semiconductor field-effect transistors (MOSFET) are used as the memory cells for the data storage. In the mask programming stage, impurities are doped into selected channel regions so as to provide the associated memory cells with different threshold voltage levels representing the storage of different values of the binary-coded data. Whether one MOSFET-based memory cell is set to store a binary digit of 0 or 1 is dependent on whether the associated channel region is doped with impurities or not. If one channel region is doped with impurities, the associated MOSFET-based memory cell is set to have a low threshold voltage, effectively setting the MOSFET-based memory cell to a permanently-ON state representing the storage of a first binary digit, for example 0; otherwise, the MOSFET-based memory cell is set to have a high threshold voltage, effectively setting the MOSFET-based memory cell to a permanently-OFF state representing the storage of a second binary digit, for example 1.

One conventional MOSFET-based ROM device is shown in FIGS. 1A through 1C, in which FIG. 1A is a schematic top view of the ROM device; FIG. 1B is a cross sectional view of the ROM device of FIG. 1 cutting through the line A–A'; and FIG. 1C is a cross sectional view of the ROM device of FIG. 1 cutting through the line B–B'.

As shown, the conventional MOSFET-based ROM device includes a semiconductor substrate, such as a P-type silicon substrate, on which a plurality of parallel-spaced bit lines 11 and a plurality of parallel-spaced word lines 13 intercrossing the bit lines 11 are formed. The word lines 13 are isolated from the underlying bit lines by an oxidation layer 12. This ROM device includes an array of MOSFET-based memory cells 14, each being associated with one segment of the word lines 13 between each neighboring pair of the bit lines 11.

Referring to FIG. 1C, in the method for fabricating the foregoing ROM device, the first step is to conduct an ion implantation process so as to dope an N-type impurity material, such as arsenic (As), into selected regions of the substrate 10 to form a plurality of parallel-spaced diffusion regions serving as the bit lines 11. The interval region between each neighboring pair of the bit lines 11 is used to serve as a channel region 16. Subsequently, a thermal oxidation process is conducted on the wafer so as to form the oxidation layer 12 over the entire top surface of the wafer. Next, a conductive layer, such as a highly-doped polysilicon layer is formed over the wafer, and then selectively removed through a photolithographic and etching process. The remaining portions of the conductive layer are used to serve as the word lines 13. This completes the fabrication of a semi-finished product of the ROM device waiting for customer order.

In the mask programming process, a mask layer 15 is first formed over the wafer. This mask layer 15 is predefined to form a plurality of contact windows according to the bit pattern of the binary-coded data that are to be programmed into the ROM device for permanent storage. These contact windows expose those channel regions that are associated with a selected group of the MOSFET-based memory cells of the ROM device that are to be set to a permanently-ON state. The covered MOSFET-based memory cells are to be set to a permanently-OFF state. Subsequently, an ion implantation process is conducted on the wafer so as to dope a P-type impurity material, such as boron (B), through the contact windows in the mask layer 15 into the exposed channel regions. This completes the so-called code implant process.

In the finished product of the ROM device, the doped channel regions cause the associated MOSFET-based memory cells to be set to have a low threshold voltage, effectively setting those MOSFET-based memory cells to a permanently-ON state representing the permanent storage of a first binary digit, for example 0. On the other hand, the undoped channel regions cause the associated MOSFET-based memory cells to be set to have a high threshold voltage, effectively setting those MOSFET-based memory cells to a permanently-OFF state representing the permanent storage of a second binary digit, for example 1.

One drawback to the foregoing MOSFET-based ROM device is that it involves quite a complex process to fabricate. Moreover, when the semiconductor structure of the MOSFET-based memory cells are further downsized for increased integration, the adverse effect of punch-through will occur, making the downsizing unable to realize. Still moreover, since the $N^+$ diffusion regions, which serve as bit lines, have a fixed cross-sectional resistance of about 100 $\Omega$/sq. (ohm per square) and are formed with a small cross section based on the conventional structure, the resistance of the bit lines are high. This causes the current from the bit lines during access operation to be low. In making a ROM device, it is usually desirable to make the current from the bit lines to be high during access operation such that the current can be easily detected.

SUMMARY OF THE INVENTION

It is therefore a primary objective of the present invention to provide a method of fabricating a semiconductor ROM device in which the coding of data into the ROM device is performing by forming contact windows rather than by performing an ion-implantation process.

It is another objective of the present invention to provide a method of fabricating a diode-based semiconductor ROM device which can prevent the occurrence of the punch-through effect in the ROM device.

It is still another objective of the present invention to provide a method of fabricating a ROM device by which the packing density of the memory cells on the ROM device is dependent on the line width of polysilicon layers such that the integration can be increased by downsizing the semiconductor components in the ROM device.

In accordance with the foregoing and other objectives of the present invention, a new semiconductor ROM device are provided.

The semiconductor structure of the ROM device of the invention is partitioned into a memory division where an array of diode-based memory cells are formed and an output division where the data stored in the memory division are read out.

The memory division of the ROM device includes the following constituent elements:

(a) a semiconductor substrate;

(b) a first insulating layer formed over said substrate;

(c) a plurality of substantially parallel-spaced first doped polysilicon layers of a first type serving as a plurality of substantially parallel-spaced data lines extending in a first direction over said first insulating layer;

(d) a second insulating layer formed over said first insulating layer and said first doped polysilicon layers;

(e) a third insulating layer formed over said second insulating layer;

(f) a plurality of contact windows formed at selected locations through said third insulating layer and said second insulating layer;

(g) a plurality of plugs formed in said contact windows, said plugs being formed from a second doped polysilicon layer of a second type; and (h) a plurality of substantially parallel-spaced conductive layers serving as word lines extending in a second direction over the third insulating layer and electrically connected to said plugs, the intersections between said word lines and said data lines defining an array of memory cells in which a first group of the memory cells of the ROM device that are connected to the plugs are set to a permanently-ON state and a second group of the memory cells of the ROM device that are connected to no plugs are set to a permanently-OFF state.

Further, the output division of the ROM device includes the following constituent elements:

(a) a plurality of gate regions formed over the first insulating layer and electrically connected to said data lines in said memory division;

(b) a plurality of source/drain regions formed in said substrate, said source/drain region serving as a plurality of bit lines;

(c) a plurality of lightly-doped regions formed in said source/drain regions proximate to said gate regions; and (d) a plurality of sidewall spacers formed on the sidewalls of said gate regions.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
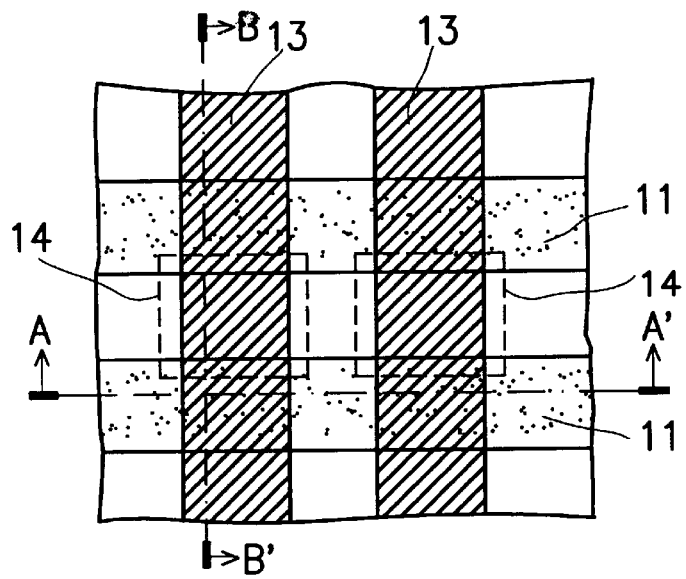
FIG. 1A is a schematic top view of a conventional semiconductor ROM device.
Figure 1B:
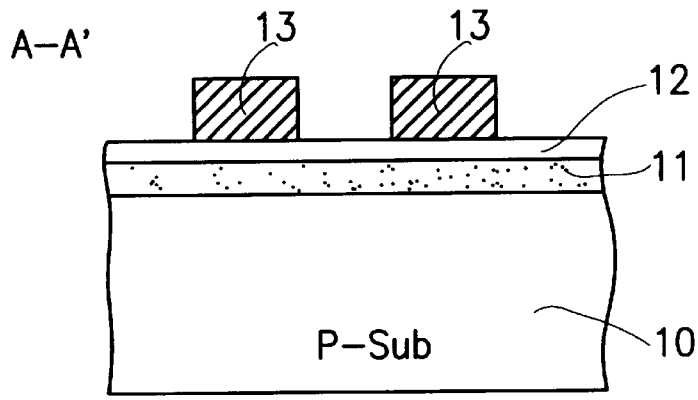
FIG. 1B is a schematic sectional view of the conventional semiconductor ROM device of FIG. 1A.
Figure 1C:
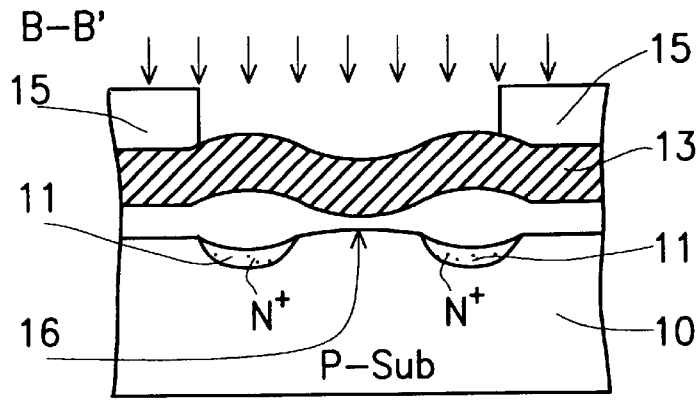
FIG. 1C is another schematic sectional view of the conventional semiconductor ROM device of FIG. 1A.

FIGS. 2A through 2I are schematic sectional diagrams used to depict the steps involved in the method of the invention for fabricating a preferred embodiment of the diode-based ROM device of the invention. In each of these figures, two sectional diagrams are shown, in which the left diagram is used to depict the fabrication of one part of the ROM device that is allocated for the forming of an array of memory cells therein (this part is hereinafter referred to as "memory division" and designated by the reference numeral 20a), while the right diagram is used to depict the fabrication of another part of the ROM device that is allocated for the forming of a series of MOSFETs therein (this region is hereinafter referred to as "output division" and designated by the reference numeral 20b).

Figure 2A:
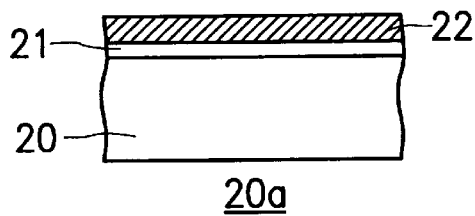
FIGS. 2A through 2I are schematic sectional diagrams used to depict the steps involved in the method of the invention for fabricating a high-density diode-based ROM device of the invention.
Figure 2A:
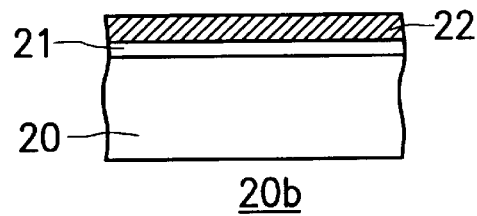

Referring first to FIG. 2A, in the first step, a semiconductor substrate 20, such as a P-type or an N-type silicon substrate, is prepared. Subsequently, a first insulating layer 21 is formed over the entire top surface of the wafer, both in the memory division 20a and in the output division 20b. The first insulating layer 21 can be a field oxide layer, or a layer of silicon dioxide or silicon nitride formed by chemical-vapor deposition (CVD). The part of the first insulating layer 21 that lies in the output division 20b will serve as a gate oxide layer. Subsequently, a conductive layer 22, such as a highly-doped polysilicon layer of a first type as N-type, is formed over the first insulating layer 21.

Figure 2B:
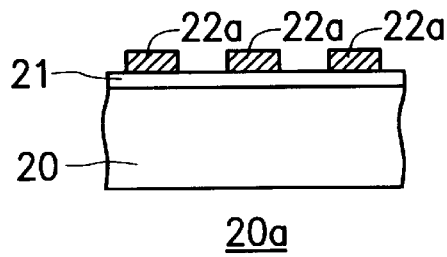
Figure 2B:
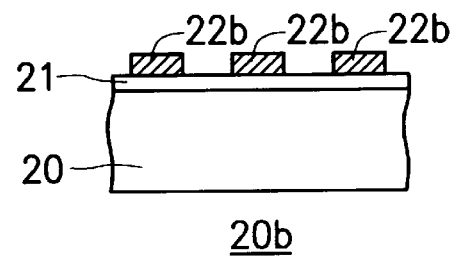

Referring next to FIG. 2B, in the subsequent step, a photolithographic and etching process is performed on the wafer so as to remove selected portions of the conductive layer 22. The remaining portions of the conductive layer 22 in the memory division 20a serve as a plurality of parallel-spaced data lines 22a, and those in the output division 20b serve as a plurality of parallel-spaced gate regions 22b. These gate regions 22b are electrically connected respectively to the data lines 22a (the connections are not illustrated in this figure; refer to FIG. 4).

Figure 2C:
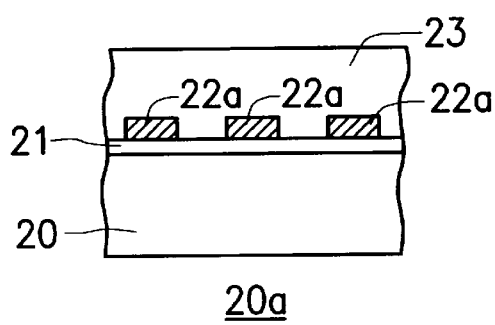
Figure 2C:
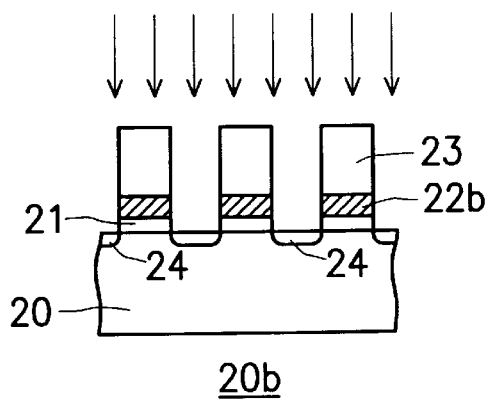

Referring further to FIG. 2C, in the subsequent step, a first photoresist layer 23 is formed over the entire top surface of the wafer. The photoresist layer 23 is then selectively removed so as to expose selected portions of the first insulating layer 21 in the output division 20b (with the photoresist layer 23 in the memory division 20a remaining intact). Next, with the photoresist layer 23 serving as a mask, an etching process is performed on the wafer so as to remove all of the exposed portions of the first insulating layer 21 in the output division 20b until the top surface of the underlying substrate 20 is exposed. After this, an ion-implantation process is performed on the exposed portions of the substrate 20, whereby a plurality of lightly-doped regions 24 are formed in the substrate 20.

Figure 2D:
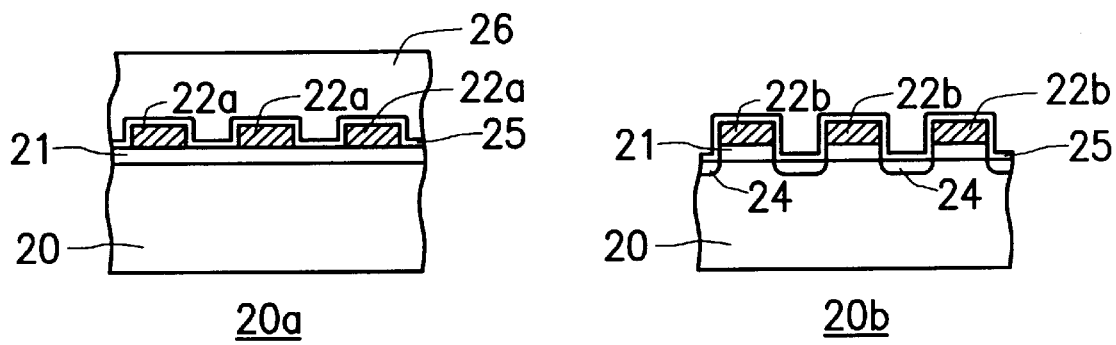

Referring further to FIG. 2D, the photoresist layer 23 is then removed. Subsequently, a second insulating layer 25 is formed over the entire top surface of the wafer, both in the memory division 20a and in the output division 20b, and then a second photoresist layer 26 is formed over the second insulating layer 25. After this, the part of the photoresist layer 26 that lies in the output division 20b is removed, whereby the top surface of the second insulating layer 25 that lies in the output division 20b is exposed, while the top surface of the second insulating layer 25 that lies in the memory division 20a is still covered by the second insulating layer 25.

Figure 2E:
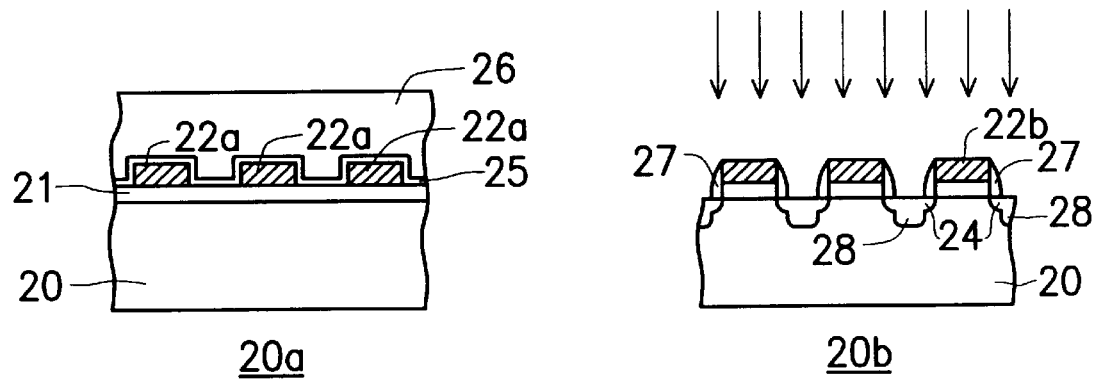

Referring to the ensuing FIG. 2E, with the photoresist layer 26 in the memory division 20a serving as a mask, an anisotropic etching process is performed on the wafer so as to remove all of the part of the second insulating layer 25 that lies in the output division 20b, whereby a plurality of sidewall spacers 27 are formed respectively on the sidewalls of the gate regions 22b. After this, an ion-implantation process is performed on the output division 20b, whereby a plurality of source/drain regions 28 are formed in the substrate 20 in the output division 20b.

Figure 2F:
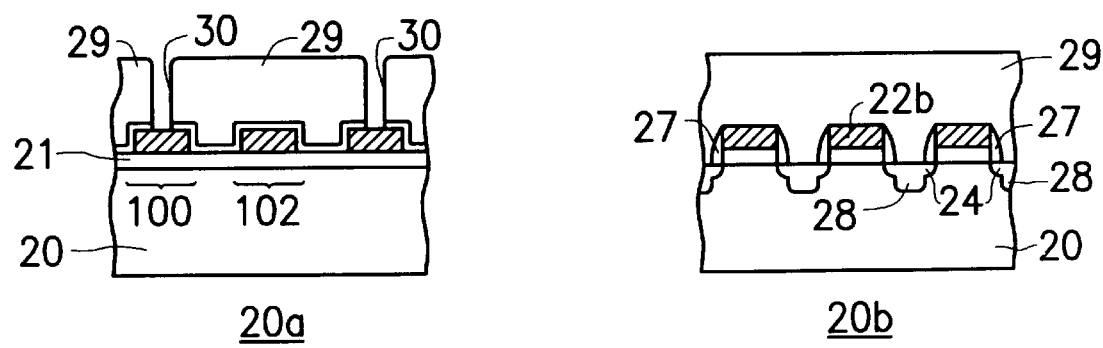

Referring next to FIG. 2F, the photoresist layer 26 is then removed. Subsequently, a third insulating layer 29, such as a layer of silicon dioxide or silicon nitride, is formed over the entire top surface of the wafer, both in the memory division 20a and in the output division 20b. Next, a photolithographic and etching process is performed on the wafer so as to remove selected portions of the third insulating layer 29 in the memory division 20a, whereby a plurality of contact windows 30 are formed in the third insulating layer 29 to expose a number of selected locations on the data lines 22a that are associated with a first group of the memory cells of the ROM device that are to be set to a permanently-ON state, representing the permanent storage of a first binary value, for example 1. By contrast, those locations on the data lines 22a that are associated with a second group of the memory cells of the ROM device that are to be set to a permanently-OFF state are unexposed and covered by the third insulating layer 29. In the case of FIG. 2F, for example, the reference numeral 100 designates one memory cell of the ROM device that is to be set to a permanently-ON state since it is exposed through one contact window; whereas the reference numeral 102 designates one memory cell of the ROM device that is to be set to a permanently-OFF state since it is not exposed.

Figure 2G:
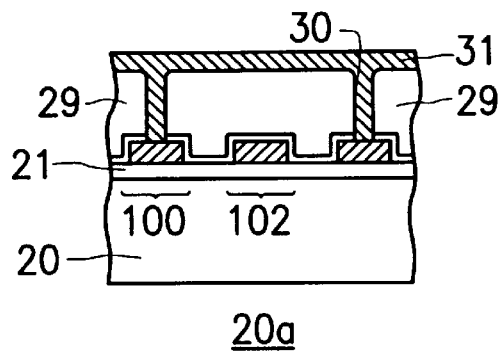
Figure 2G:
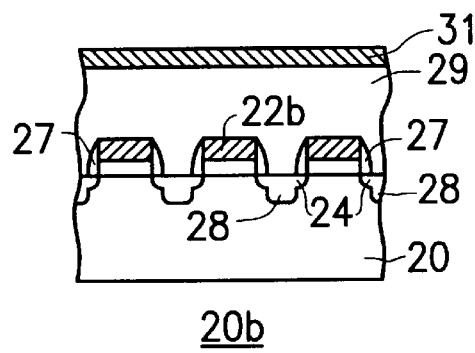

Referring next to FIG. 2G, in the subsequent step, a highly-doped polysilicon layer 31 of a second type as the P-type, is deposited over the entire top surface of the wafer until at least it fills up all of the contact windows 30 in the third insulating layer 29. The highly-doped polysilicon layer 31 can be formed by, for example, first depositing a polysilicon layer over the third insulating layer 29, and then performing an ion-implantation process to dope a P-type impurity material into the polysilicon layer, or instead performing a chemical-vapor deposition (CVD) method using $SiH_4$ and $B_2H_6$ as the vapor to form the highly-doped P-type polysilicon layer 31 in-situ.

Figure 2H:
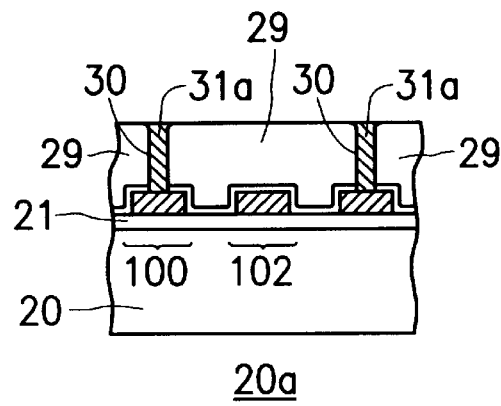
Figure 2H:
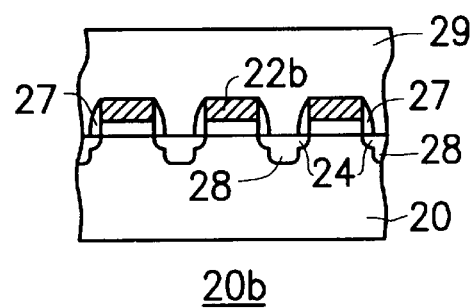

Referring further to FIG. 2H, the thickness of the highly-doped P-type polysilicon layer 31 that is layered above the topmost surface of the third insulating layer 29 is removed by performing, for example, an anisotropic etch-back process or a chemical-mechanical polish (CMP) process thereon, leaving only the portions that are laid in the contact windows 30. The remaining portions of the highly-doped P-type polysilicon layer 31 that are laid in these contact windows 30 serve as a plurality of plugs 31a that are electrically connected to the exposed portions of the data lines 22a. Since these plugs 31a are P-type doped regions while the data lines 22a are N-type doped regions, a PN junction diode is formed for each of the memory cells that are associated with the plugs 31a and set to a permanently-ON state.

Figure 2I:
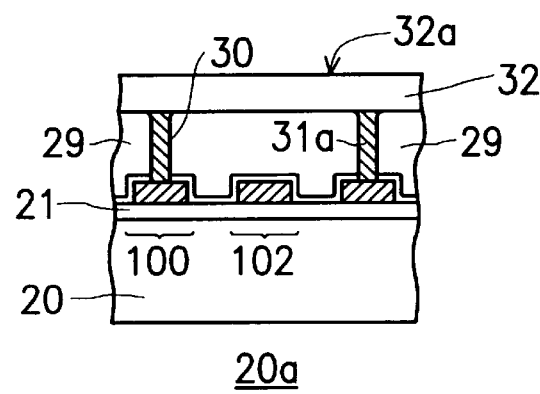
Figure 2I:
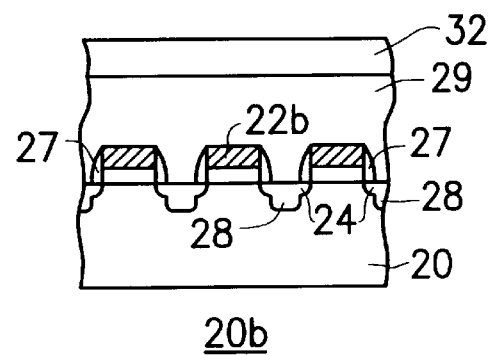

Referring further to FIG. 2I, in the subsequent step, a conductive layer 32, such as a highly-doped polysilicon layer of the second type, is formed over the entire top surface of the wafer, both in the memory division 20a and in the output division 20b. Next, a photolithographic and etching process is performed on the wafer so as to remove selected portions of the conductive layer 32. The remaining portions of the conductive layer 32, as designated by the reference numeral 32a, serve as a plurality of parallel-spaced word lines. This completes the fabrication of the main structure of the ROM device in accordance with the invention. Subsequent processes for finishing the product of the ROM device are all conventional processes so description thereof will not be further detailed.

Figure 3:
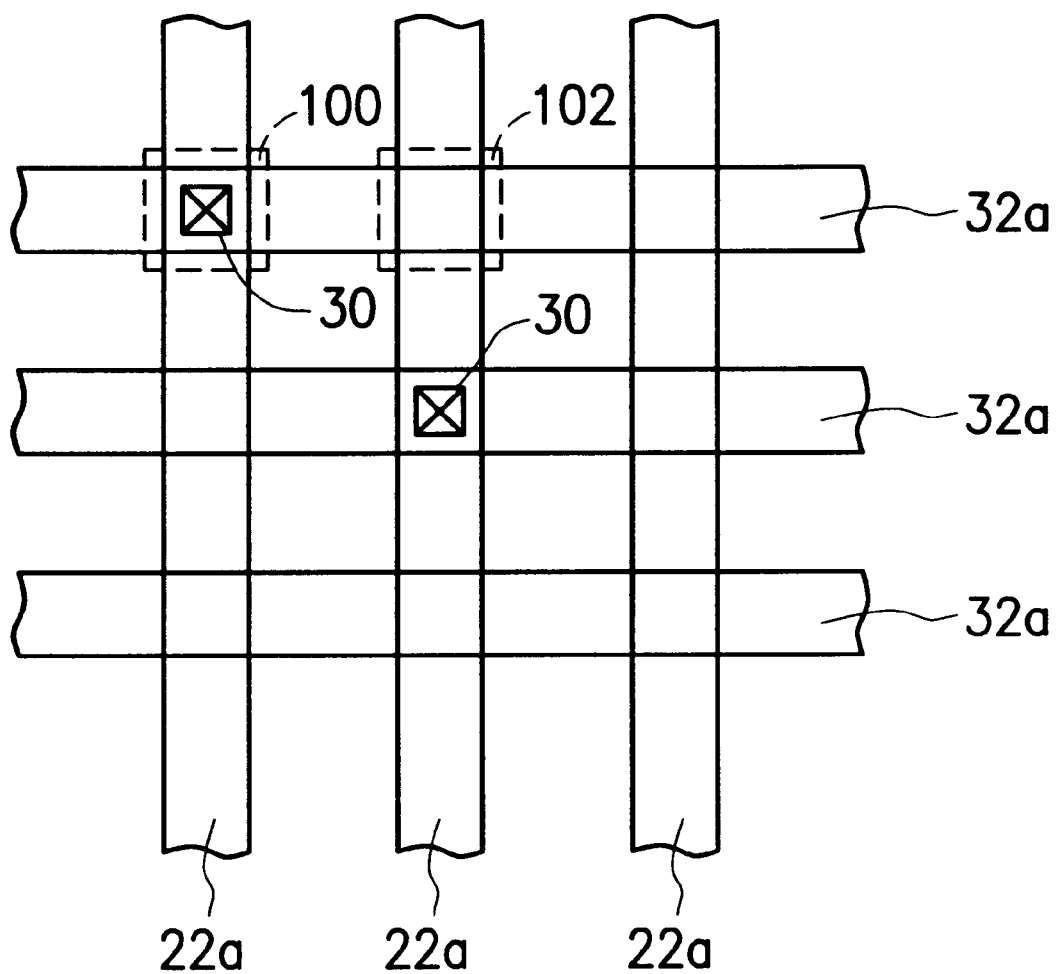
FIG. 3 is a schematic top view of the finished product of the diode-based ROM device of the invention.

FIG. 3 is a top view of the memory division 20a of the ROM device. As shown, the word lines 32a are arranged in such a manner as to intercross the data lines 22a substantially in perpendicular. The intersections between the word lines 32a and the data lines 22a constitute an array of memory cells for the ROM device. If a contact window is formed in one intersection, the associated memory cell is set to a permanently-ON state; whereas if not, the associated memory cells is set to a permanently-OFF state. For instance, as in the case of FIG. 2I, the memory cell 100 is set to a permanently-ON state since a contact window 30 (as indicated by a crossed box) is formed therein; while the memory cell 102 is set to a permanently-OFF state since no contact window is formed therein.

In various other embodiments, for example, the conductive layer 22 formed from a highly-doped N-type polysilicon layer can be instead P-type; and the highly-doped P-type polysilicon layer 31 can be instead N-type. This variation makes the data lines 22a of N-type doped area to be changed to P-type, and the plugs 31a of P-type doped area to be changed to N-type. This only changes the forward direction of the PN junction diodes formed by the combination of the plugs 31a and the data lines 22a.

Figure 4:
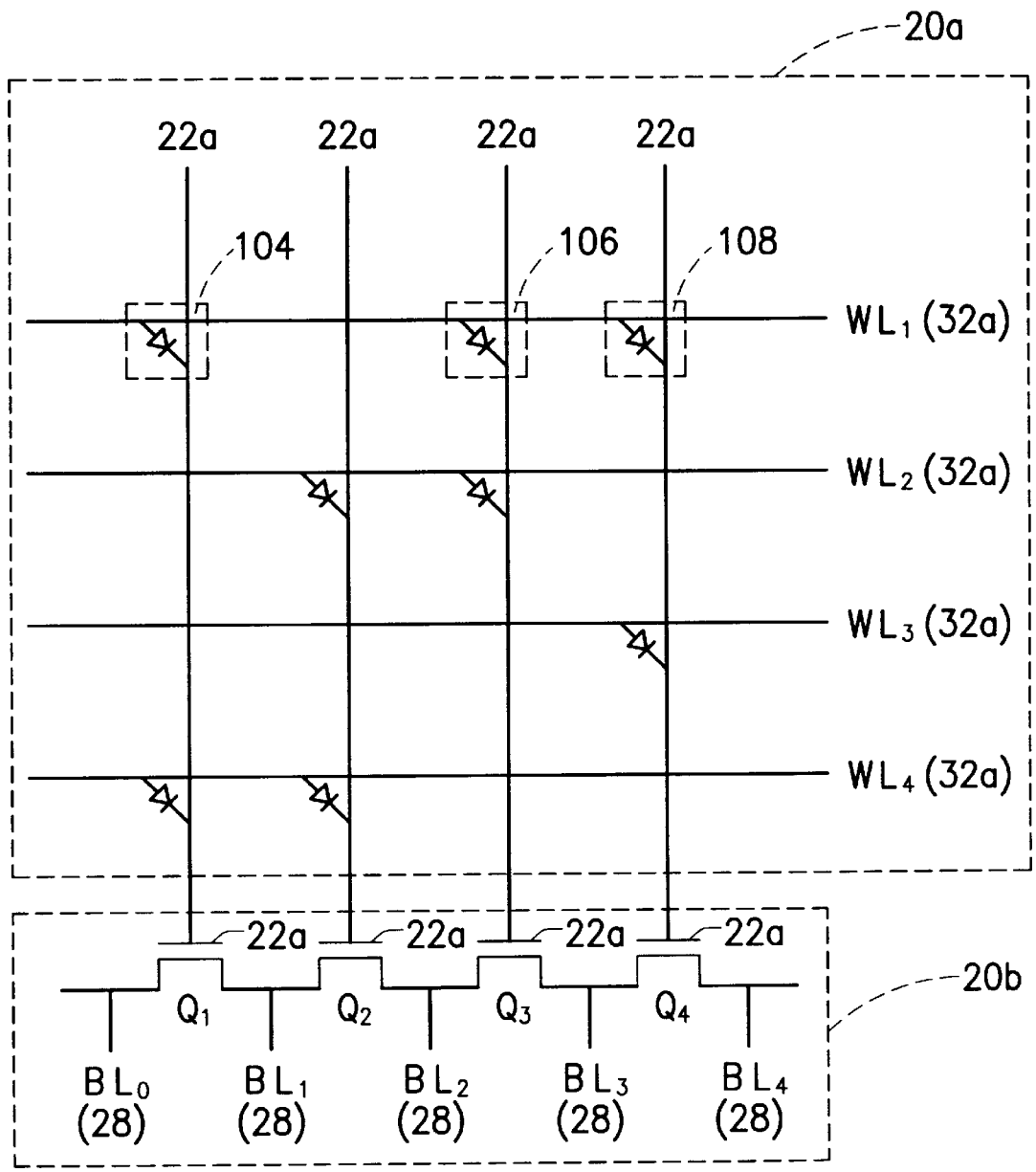
FIG. 4 shows an equivalent circuit diagram of the diode-based ROM device of the invention.

FIG. 4 shows an equivalent circuit diagram of the ROM device, including both of the memory division 20a and the output division 20b.

In the memory division 20a, the word lines 32a (WL1, WL2, WL3, WL4) and the data lines 22a are intercrossed to form an array of memory cells. In this circuit diagram, the memory cells that are set to a permanently-ON state are each labeled with a diode symbol, as for example the three memory cells respectively designated by the reference numerals 104, 106, 108; while the memory cells that are set to a permanently-OFF state are labeled with no diode symbol.

In the output division 20b, a plurality of MOSFETs Q1, Q2, Q3, Q4 are formed. The gate region (22b in FIGS. 2A–2I) of each of these MOSFETs Q1, Q2, Q3, Q4 is connected to a corresponding one of the data lines 22a. Further, the source/drain regions (28 in FIGS. 2A–2I) of these MOSFETs Q1, Q2, Q3, Q4 are connected respectively to a plurality of bit lines BL0, BL1, BL2, BL3, BL4.

To gain access to the data stored in the ROM device, a high voltage is applied to the word lines; and as a result of this, the corresponding data will be read out from the bit lines BL0, BL1, BL2, BL3, BL4. For instance, when a high voltage is applied to the word line WL1, the induced current will pass through the diodes in the memory cells 104, 106, 108 respectively to the gate regions of the MOSFETs Q1, Q3, Q4. As a result, these MOSFETs Q1, Q3, Q4 are switched on, allowing the corresponding bit lines BL1, BL3, BL3 to receive currents.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ROM device of the type including an array of diode-based memory cells, which comprises:
   a semiconductor wafer partitioned into a memory division and an output division;
   wherein
   said memory division comprises:
      a semiconductor substrate;
      a first insulating layer formed over said substrate;
      a plurality of substantially parallel-spaced first doped polysilicon layers of a first type serving as a plurality of substantially parallel-spaced data lines extending in a first direction over said first insulating layer;
      a second insulating layer formed over said first insulating layer and said first doped polysilicon layers;
      a third insulating layer formed over said second insulating layer;
      a plurality of contact windows formed at selected locations through said third insulating layer and said second insulating layer;
      a plurality of plugs formed in said contact windows, said plugs being formed from a second doped polysilicon layer of a second type; and
      a plurality of substantially parallel-spaced conductive layers serving as word lines extending in a second direction over the third insulating layer and electrically connected to said plugs, the intersections between said word lines and said data lines defining an array of memory cells in which a first group of the memory cells of the ROM device that are connected to the plugs are set to a permanently-ON state and a second group of the memory cells of the ROM device that are connected to no plugs are set to a permanently-OFF state; and
   wherein
   said output division comprises:
      a plurality of gate regions formed over the first insulating layer and electrically connected to said data lines in said memory division;
      a plurality of source/drain regions formed in said substrate, said source/drain region serving as a plurality of bit lines;
      a plurality of lightly-doped regions formed in said source/drain regions proximate to said gate regions; and
      a plurality of sidewall spacers formed on the sidewalls of said gate regions.

2. The ROM device of claim 1, wherein said first doped polysilicon layers are formed from a highly-doped N-type polysilicon, and said second doped polysilicon layers are formed from a highly-doped P-type polysilicon.

3. The ROM device of claim 1, wherein said first doped polysilicon layers are formed by selective removal of a highly-doped P-type polysilicon layer, and said second doped polysilicon layers are formed by selective removal of a highly-doped N-type polysilicon layer.

4. The ROM device of claim 1, wherein said first insulating layer is a layer of silicon nitride.

5. The ROM device of claim 1, wherein said second insulating layer is a layer of silicon nitride.

6. The ROM device of claim 1, wherein said second insulating layer is a layer of silicon dioxide.

7. The ROM device of claim 1, wherein said third insulating layer is a layer of silicon dioxide.

8. The ROM device of claim 1, wherein said word lines are formed by selective removal of a highly-doped polysilicon layer.

9. The ROM device of claim 1, wherein said word lines are formed by selective removal of a metallization layer.

10. The ROM device of claim 1, wherein said second direction is substantially in perpendicular to said first direction.

\* \* \* \* \*